United States Patent
Jenkins et al.

(10) Patent No.: US 7,386,287 B2
(45) Date of Patent: Jun. 10, 2008

(54) METHOD FOR CONTROLLING THE GAIN OF RADIO-FREQUENCY SIGNAL

(75) Inventors: Roland Jenkins, Wesel (DE); Ralf Herzberg, Hemer (DE); Jörg Nagel, München (DE); Mathias Kleinsorge, Wedemark (DE)

(73) Assignee: Siemens Aktiengesellschaft, Munich (DE)

( * ) Notice: Subject to any disclaimer, the term of this patent is extended or adjusted under 35 U.S.C. 154(b) by 90 days.

(21) Appl. No.: 10/482,848

(22) PCT Filed: Jun. 28, 2002

(86) PCT No.: PCT/DE02/02279

§ 371 (c)(1),
(2), (4) Date: Jan. 5, 2004

(87) PCT Pub. No.: WO03/005564

PCT Pub. Date: Jan. 16, 2003

(65) Prior Publication Data

US 2004/0185809 A1 Sep. 23, 2004

(30) Foreign Application Priority Data

Jul. 3, 2001 (DE) ............................. 101 32 047
Jul. 25, 2001 (DE) ............................. 101 36 213

(51) Int. Cl.
*H04B 1/06* (2006.01)
*H04B 1/00* (2006.01)

(52) U.S. Cl. .................. 455/232.1; 455/127.2

(58) Field of Classification Search ............. 455/115.1, 455/126, 127.1, 127.2, 230–234.2, 343.1, 455/343.5

See application file for complete search history.

(56) References Cited

U.S. PATENT DOCUMENTS

| 5,093,667 A | 3/1992 | Andricos |
| 5,886,572 A | 3/1999 | Myers et al. |
| 6,043,707 A | 3/2000 | Budnik |
| 6,141,541 A | 10/2000 | Grosspietsch et al. |
| 6,236,267 B1 | 5/2001 | Anzil |
| 6,275,102 B1 * | 8/2001 | Muza .......................... 330/85 |
| 6,407,634 B1 * | 6/2002 | Staudinger et al. .......... 330/149 |

(Continued)

FOREIGN PATENT DOCUMENTS

CN 1234922 11/1999

(Continued)

*Primary Examiner*—Duc M. Nguyen
*Assistant Examiner*—Michael Thier
(74) *Attorney, Agent, or Firm*—Bell, Boyd & Lloyd LLP

(57) ABSTRACT

The present invention relates to a method for adjusting the amplification of a high frequency signal, a transmitter or receiver unit and a communication system. The aim of the invention is to provide a method and device for improved use of a polar-loop concept in a transmitter, especially for a mobile radio link. According to the method for adjusting the amplification of a high frequency signal, wherein the phase angle and the amplitude of an error-free input signal are separated from each other with a defined part of an output signal and readjusted, an output voltage of a battery voltage modulator is evaluated as a measure for an error at the output of a transmitter amplifier and taken into account in order to provide a correction.

19 Claims, 4 Drawing Sheets

U.S. PATENT DOCUMENTS 6,449,465 B1 * 9/2002 Gailus et al. ................ 455/126
6,898,257 B2 * 5/2005 Fischer et al. ............... 375/376

FOREIGN PATENT DOCUMENTS

| | | |
|---|---|---|
| JP | 7066644 | 10/1995 |
| JP | 10233633 | 2/1998 |
| JP | 2001060841 | 6/2001 |
| WO | WO 01/24356 | 4/2001 |

* cited by examiner

US 7,386,287 B2

METHOD FOR CONTROLLING THE GAIN OF RADIO-FREQUENCY SIGNAL

BACKGROUND OF THE INVENTION

The present invention relates to a method for controlling the gain of a radio-frequency signal, to a transmitting and/or receiving unit and to a communications system.

Particularly in the case of mobile radio links, modulation methods which influence both the amplitude or envelope curve and the phase angle of the signal to be transmitted are used in order to increase the transmission rate. Examples of this are the relatively modern variants of the Global Standard for Mobile Communication (GSM), such as Enhanced Data rate for GSM Evolution (EDGE), and Code-Division Multiplexing (CDM), or Code-Division Multiple Access (CDMA).

A transmitter for a mobile radio link such as this is subject to stringent linearity requirements, in order to prevent errors during transmission. A significant proportion of the nonlinearity of a transmitter such as this is caused in the transmitter amplifier. According to the prior art, the so-called polar loop concept is used, for example, in order to linearize this transmitter amplifier. In this method, the amplitude modulation is applied to the transmission signal separately from the phase modulation, with two separate control loops being provided for this purpose. The method can be implemented in a polar loop transmitter by, for example, modulation of the supply voltage of a power amplifier which is operated highly non-linearly in the C, D or E mode. On the basis of the polar loop concept, optimized efficiency transmitter amplifiers can be used which, in addition to compliance with a required linearity, also reduce the current that is drawn. Since, particularly in a mobile radio link, at least one subscriber terminal is in the form of a mobile telephone, this considerably reduces the costs for a rechargeable battery for a mobile telephone, and/or increases the maximum operating time of a charged battery set.

If the transmitter amplifier is mismatched as a result of impedance changes in an antenna, such as those which occur in the case of large antennas as a result, for example, of a wind load and in the case of mobile telephones as a result, for example, of a change in the distance between the head and the antenna, the control gradient of the transmitter amplifier changes. The control loop bandwidth of the amplitude control loop is, thus, also changed. This leads to undesirable distortion of the output voltage which is evident, in particular, in a deterioration in the modulation spectrum, which may be sufficiently severe to contravene the spectrum mask which is subject to a fixed specification by virtue of a standard in this field.

One known solution to this problem is to isolate the transmitter amplifier from the antenna through the use of circulators or isolators. However, circulators are relatively narrow-band components, so that two or more circulators must be interconnected in order to cover a wider bandwidth. Furthermore, these components are very expensive and, in addition, occupy rather a large amount of space, as a result of which the actually highly advantageous polar loop concept is not financially acceptable, particularly in so-called multiband appliances, owing to the use of a number of circulators.

In the radio transmission systems which have been mentioned above, by way of an example, the modulation of the transmission signal includes amplitude modulation. The modulation may be provided, for example, by variation of the drain voltage in the case of field-effect transistors, or of the collector voltage in the case of bipolar transistors and the anode voltage when electronic valves are used in the transmitter amplifier. Parasitic phase modulation occurs in this case because the phase of the complex transfer function $S_{21}$ is dependent on the drain/source voltage $U_{DS}$ or $U_D$ or on the collector/emitter voltage $U_{CE}$. If the modulation that is used in the radio transmission system is a combination of amplitude modulation and phase modulation, as is the case, for example, in G2.5 and G3 mobile radio systems, then the phase modulation component is corrupted by an additional parasitic phase modulation component $\Delta\phi(A(t))$. This corruption results, for example, in an increased error vector and/or an increased bandwidth requirement.

During operation of the transmitter amplifier for a mobile radio link, the respectively involved control loops may be affected both as a result of parasitic phase modulation and by impedance changes in an antenna or the like.

The present invention is, therefore, directed toward a method and an apparatus for improved utilization of a polar loop concept in a transmitter; in particular, for a mobile radio link.

SUMMARY OF THE INVENTION

Accordingly, the fundamental idea of the present invention is to assess an output voltage from a battery voltage modulator as a measure of any error at an output of a transmitting amplifier, and to use the output voltage to produce a correction value. Particular embodiments of this method relate to the compensation for an error resulting from a change in the control loop bandwidth of the amplitude control loop and compensation for an error resulting from parasitic phase modulation. The respective measures for compensating for parasitic phase modulation and for any change in the control loop bandwidth of the amplitude control loop may, of course, in each case be combined with one another. In this context, it is possible, particularly for combining functionally similar components of the transmitting and/or receiving unit, to form one component. This also applies to the associated inventive communications systems.

A method according to the present invention is accordingly distinguished in that an output voltage from the battery voltage modulator is used as a measure of the variation of the control loop bandwidth of the amplitude control loop in a polar loop transmitter in the event of a mismatch at the output of the transmitter amplifier. This signal advantageously already exists in known circuits, so that no additional measurement points and/or measurement apparatuses need be provided. It is thus advantageously possible to use the output voltage from the battery voltage modulator as an indicator of a change in the control loop bandwidth of the amplitude control loop, and to use the output voltage for correction purposes.

In one embodiment of the present invention, a correction value is determined using an input signal and an instantaneous output voltage from the battery voltage modulator and is used to compensate for the variation in the control gradient of the transmitter amplifier and, thus, for the control loop bandwidth. In a further preferred embodiment of the present invention, a control signal for the battery voltage modulator is varied by the correction value; in particular, by driving a controlled intermediate amplifier. Furthermore, the control loop bandwidth is indirectly readjusted via a new control loop on the basis of a family of characteristics which is recorded once for a transmitter amplifier or is recorded for an entire range of transmitter amplifiers.

A family of characteristics such as this preferably is also stored in a memory, taking into account tolerance values. The required correction values can be read quickly in a known manner via accesses having A/D and D/A converters.

The method according to the present invention can be integrated with very little additional circuit complexity in a transmitting and/or receiving unit. The additional space required and the intrinsic power demand of an extended circuit are advantageously very small. Furthermore, the creation or recording of a family of characteristics, as mentioned above, is associated with relatively little complexity, so that the method according to the present invention can be used advantageously in a communications system which includes at least one transmission path according to a mobile radio standard. In particular, a transmitting and/or receiving unit is in the form of a mobile telephone, as part of a communications system such as this. However, owing to the advantages mentioned above, the method according to the present invention also can be used in, or retrofitted to, any other transmitting and/or receiving unit.

A further method according to the present invention is distinguished in that an output voltage from the battery voltage modulator is assessed as a measure of any phase error to be expected from the amplifier in the transmitter amplifier. The output voltage from the battery voltage modulator can be accessed easily and directly as a signal within a circuit operating on the basis of this method, so that there is no need to provide any additional measurement points and/or measurement apparatuses. This advantageously makes it possible to use the output voltage from the battery voltage modulator as an indicator of any phase error in the amplifier, and to use the output voltage for correction purposes.

In another embodiment of the present invention, a correction value is determined using an instantaneous output voltage from the battery voltage modulator, and the correction value is used to compensate for the erroneous change in the phase transmission through the transmitter amplifier. In a further preferred embodiment of the present invention, this correction value is taken from a characteristic. A characteristic such as this is preferably also stored digitally in a memory, taking into account tolerance values. The required correction values can be read quickly in a known manner via accesses with A/D and D/A converters. The phase response is also readjusted via a compensation circuit on the basis of a family of characteristics which is recorded once for a transmitter amplifier, or is recorded for an entire range of transmitter amplifiers.

In another preferred embodiment of the present invention, the phase of the complex circuit parameter $S_{21}$ of the transmitter amplifier is a rising function of the voltage $U_{DS}$ or $U_{CE}$. The parasitic phase modulation thus can be neutralized by the phase of the parameter $S_{21}$ being a falling function of the gate/source voltage $U_{GS}$ or the base current IB. This falling function is then linked in some suitable manner to $U_{DS}$ or $U_{CE}$, the output signal from the battery voltage modulator. In one preferred embodiment of the present invention, the parasitic influence of the supply voltage of the transmitter amplifier, which carries the signal, and the effect of any change in the operating point in time with the payload signal, counteract one another. A correction value for a specific band is thus permanently set via a simple voltage divider. A corresponding circuit and measurement results also will be described on the basis of a specific exemplary embodiment and with reference to the drawings.

The method according to the present invention can be integrated in a transmitting and/or receiving unit with very little additional circuit complexity. The additional space requirement and intrinsic energy demand of an extended circuit are advantageously very small. The creation or recording of the characteristics mentioned above is also associated with relatively little effort, so that the method according to the present invention can be used particularly advantageously in a communications system which includes at least one transmission path according to a mobile radio standard. In particular, the transmitting and/or receiving unit is in the form of a mobile telephone, as part of a communications system such as this. However, owing to the advantages mentioned above, the method according to the present invention also can be used in, or retrofitted to, any other transmitting and/or receiving unit. The compact form also allows a high degree of integration for multiband systems for mobile telephones.

Additional features and advantages of the present invention are described in, and will be apparent from, the following Detailed Description of the Invention and the Figures.

DETAILED DESCRIPTION OF THE INVENTION

Figure 2:
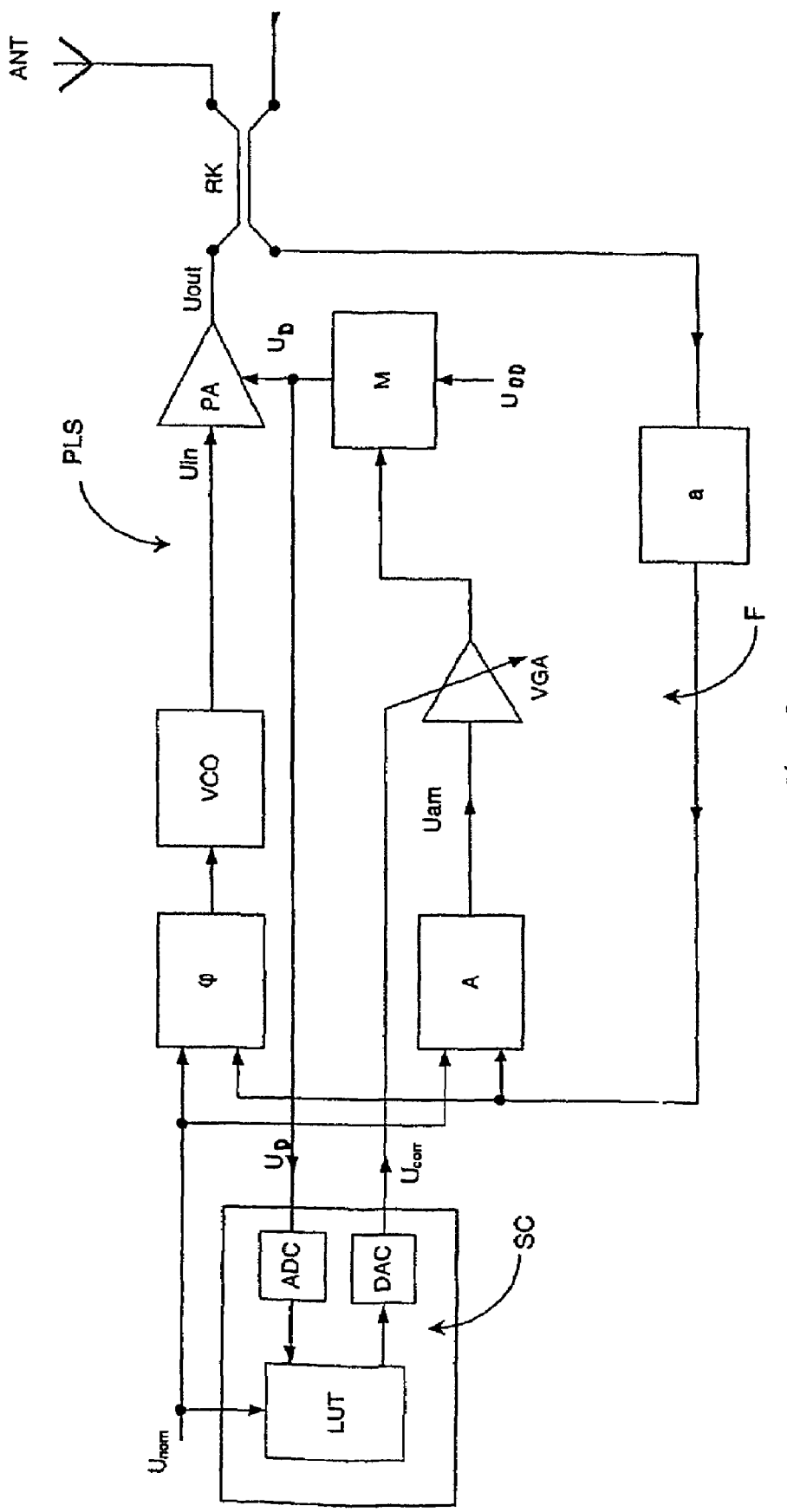
FIG. 2 shows a simplified block diagram of an embodiment according to the present invention.

In detail, FIG. 2 relates to an exemplary embodiment of the present invention in which an error at the output of a transmitter amplifier is due to a change in the control loop bandwidth of an amplitude control loop, while FIGS. 3 to 9 relate to an exemplary embodiment of the present invention in which the aim is to neutralize parasitic phase modulation.

In a polar loop control system, the phase angle and amplitude of an error-free input signal $U_{nom}$ to a polar loop transmitter PLS are compared with a defined part of an output signal $U_{out}$, and are readjusted, if necessary, in separate control loops in a phase comparator $\phi$ and an amplitude comparator A. The defined part of the output signal $U_{out}$ is fed back to the input of the polar loop transmitter PLS, on a trial and error basis, via a feedback path F and provided with a matching or attenuation factor a. In this case, the output signal $U_{out}$ represents the signal which is supplied to an antenna ANT from the polar loop transmitter PLS. A directional coupler RK between the output of the transmitter amplifier PA and the antenna ANT separates a forward wave of the output signal $U_{out}$ and a backward wave, which is produced by reflection by the antenna ANT, which is generally not matched to the characteristic impedance of the supply line. The signal $U_{out}$ thus represents only the forward wave.

The output signal from the phase comparator φ regulates the phase angle of $U_{out}$ at the nominal value that is predetermined by $U_{nom}$ via a voltage controlled oscillator VCO. Via the control signal $U_{am}$ and via the battery voltage modulator M, the amplitude comparator A influences the supply voltage $U_D$ to a transmitter amplifier PA and, hence, the envelope curve of the output voltage, such that the amplitude of $U_{out}$ is likewise an error-free map of the amplitude of $U_{nom}$.

However, the gradient of the transmitter amplifier PA is dependent on the respective load of a termination. A mismatch caused by a change in the impedance of the antenna ANT thus also varies the gradient of the transmitter amplifier PA. Impedance changes such as these occur quickly as a result of changes in the environment and/or in the geometry of the antenna ANT. These occur correspondingly frequently. If the output signal $U_{out}$ is also kept substantially constant via the amplitude control loop, however, then any change in the gradient of the transmitter amplifier PA directly affects the control loop bandwidth of the amplitude control loop as well as the modulation spectrum, resulting in unacceptable distortion.

An aim of the embodiment of the present invention as shown in FIG. 2 is to keep the control loop bandwidth of the amplitude control loop in the polar loop transmitter PLS constant, even in the event of a change to the impedance of the antennas ANT and in the event of a mismatch caused by this, in order to ensure the necessary linearity of the output signal $U_{out}$ while complying with a predetermined modulation spectrum, a specific bit error rate, etc. However, there is no need to use expensive and large circulators in this case.

A mismatch of the transmitter amplifier PA caused by impedance changes from an antenna ANT will produce a change in the output signal $U_{out}$. The signal $U_D$ is produced at the output of the battery voltage modulator M via the feedback path F and is readjusted via the amplitude control loop until any error between $U_{out}$ and a predetermined value is regulated out. Thus, $U_D$ can be used as an indicator of load changes.

Figure 1:
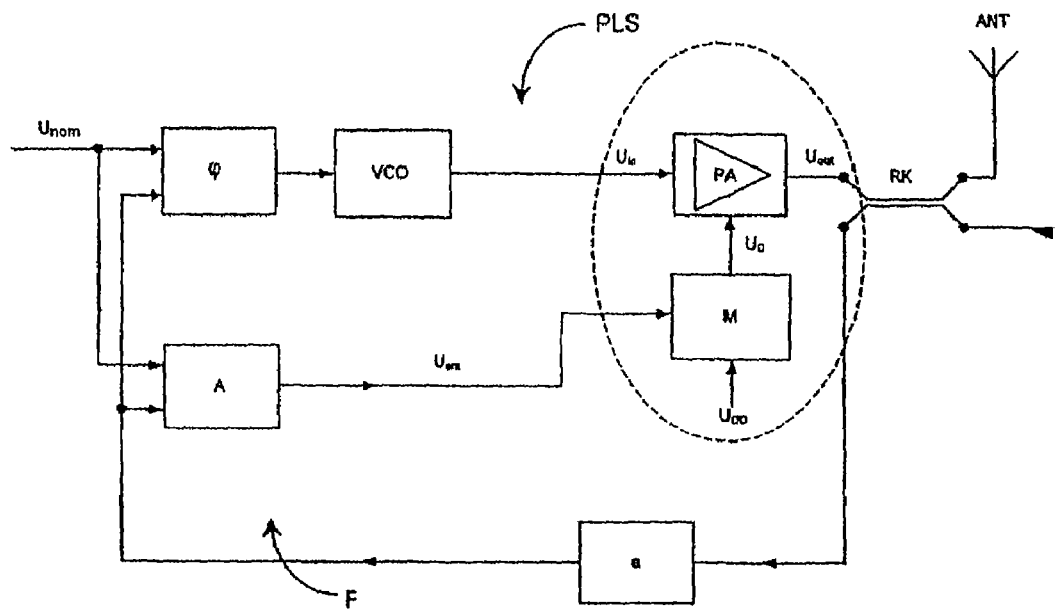
FIG. 1 shows a simplified block diagram relating to the implementation of a known polar loop control with a battery voltage modulator.

In the following text, the output voltage $U_D$ from the battery voltage modulator M is assessed as a measure of the variation of the control loop bandwidth of the amplitude control loop in the polar loop transmitter PLS, in response to a mismatch at the output of the transmitter amplifier PA. A correction value $U_{corr}$ is produced on the basis of this assessment and can be used to produce the original control loop bandwidth once again. This is advantageously based on a circuit as shown in FIG. 1, which is extended only slightly by a small number of circuit additions, in a manner illustrated in FIG. 2.

For assessment and subsequent correction, the instantaneous output voltage $U_D$ from the battery voltage modulator M is read by a system controller SC which has been newly added in the circuit shown in FIG. 2. Since $U_{nom}$ and any attenuation a in the feedback path F of the system controller are known, the instantaneous control gradient S of the transmitter amplifier PA $$S = \frac{U_{out}}{U_D} = \frac{(U_{nom} - a)}{U_D}$$

can thus be determined.

The output voltage $U_D$ from the battery voltage modulator M is converted from the battery voltage $U_{DD}$ via an analog/digital converter ADC for processing. In the present embodiment of the present invention, a correction value $U_{corr}$ can be found via a look-up table LUT, by comparison of a digitized value with a gradient S, that is determined once, for the transmitter amplifier PA on standard termination. The correction value $U_{corr}$ is either predetermined directly or, as described in the present exemplary embodiment, via a digital/analog converter DAC in a variable amplifier VGA. In this case, the correction value $U_{corr}$ results in the control loop bandwidth of the amplitude control loop being corrected, and in the original control loop bandwidth being restored. A characteristic which remains substantially the same over the predetermined bandwidth while complying with industry standards is thus guaranteed in this case for a polar loop transmitter PLS as shown in FIG. 2.

The advantages of the described embodiment, for example in the case of a dual-band mobile radio, are, in particular, that it is possible to use static or nonvolatile memories which can be loaded as required with values for each selectable band. Operation in two or more bands is thus dependent only on a memory LUT of slightly larger size but does not result in any other change to the circuit. The advantage of compact construction is thus retained for every application of an apparatus according to the present invention. In consequence, the extension to the system controller SC itself can be represented as a large-scale integrated circuit. A system controller SC then can be retrofitted in a particularly simple manner in any polar loop transmitter PLS. However, the entire circuit of the polar loop transmitter PLS also may be in the form of a large-scale integrated circuit, and there is advantageously no need for any further hybrid components such as isolators, even for mobile telephone systems covering more multiple bands. An apparatus according to the present invention with a very compact form is thus suitable for use in two or more frequency bands.

Figure 3:
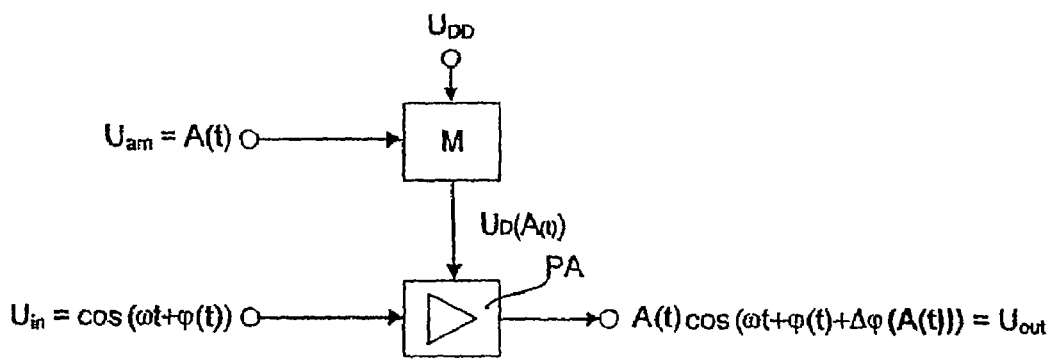
FIG. 3 shows a simplified block diagram relating to the implementation of amplitude modulation with a transmitter amplifier as a component of the circuit shown in FIG. 1.

The illustration in FIG. 3, which relates to the embodiment of the present invention for neutralization of parasitic phase modulation, shows only one enlarged detail, which is surrounded by a dashed line in FIG. 1, of the polar loop transmitter PLS with the applied signals. A battery voltage monitor M is connected to a supply voltage $U_{DD}$, which is fed into the transmitter amplifier PA via the signal $U_{in}$ as an input signal, as the output signal $U_D(A(t))$ whose amplitude varies in accordance with the preset variable A(t). On the basis of $U_D(A(t))$ an input signal $U_{in}$ as a cosine oscillation is amplified with a variable-time phase term φ(t) and information in the amplitude A(t). The output signal from this circuit is thus a signal which oscillates in the form of a cosine wave with time t with a variable-time amplitude A(t), a variable-time phase term φ(t) and an additional phase shift Δφ(A(t)) which is dependent on the magnitude of the input signal $U_{in}$. This additional phase shift Δφ(A(t)) makes itself evident in a negative manner as a phase error or as parasitic phase modulation in the output signal, via an information error.

An aim of the embodiment according to the present invention as shown in FIG. 3 is to keep any parasitic phase modulation Δφ(A(t)), with the resultant errors in a signal to be transmitted, as small as possible, in order to ensure the required linearity in the output signal Uout while complying with a predetermined modulation spectrum, a specific bit error rate, etc. This considerably reduces the load on the actual phase locked loop illustrated in FIG. 1. The output voltage UD(A(t)) from the battery voltage modulator M will be assessed in the following text as a measure of any parasitic phase modulation Δφ of the transmitter amplifier PA. The production of a correction value k, via which the phase error Δφ can be minimized, will be described on the basis of this assessment. This is advantageously based on a circuit as shown in FIG. 1, which is extended only slightly, by minor circuit additions, in a manner which is illustrated in the illustration in FIG. 4.

Figure 4:
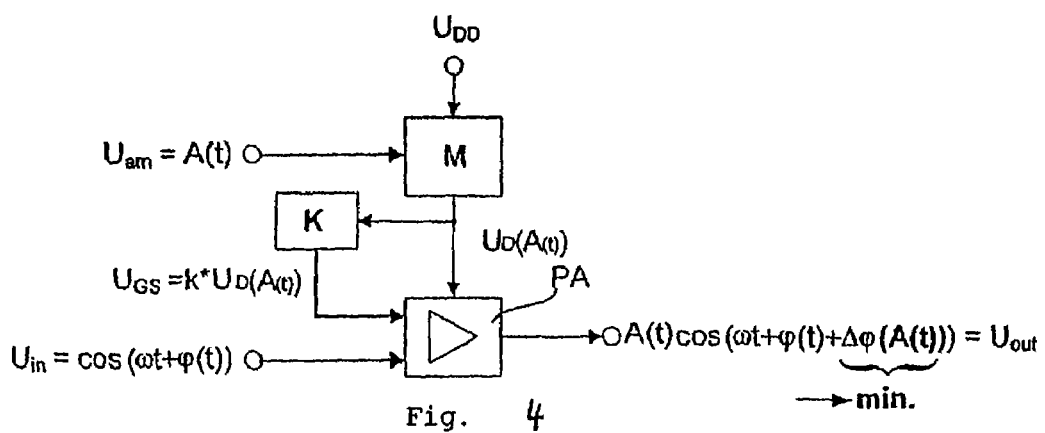
FIG. 4 shows a simplified block diagram of an embodiment according to the present invention with a compensation circuit.

In the illustration shown in FIG. 4, the signal $U_D(A(t))$ is used to largely eliminate the phase error $\Delta\phi(A(t))$ to be expected, by determining a correction variable k as a function of the magnitude of the signal $U_D(A(t))$ from a circuit K, and by feeding this together with the cosine oscillation $U_{in}$ as an input signal into the transmitter amplifier PA. In the present exemplary embodiment, k is a factor via which the magnitude of the signal $U_D(A(t))$ is adapted in a suitable manner in order to minimize the phase error $\Delta\phi(A(t))$. According to the present invention, the correction is introduced via the bias voltage $U_{bias}$, by means of the signal $U_{GS}$ in order to change the operating point of the transmitter amplifier PA. In this context, it has been found that a change in the operating point setting in time with the signal $U_D(A(t))$ has an effect which counteracts the parasitic phase effect. An essentially undisturbed phase profile is thus guaranteed for a polar loop transmitter PLS as shown in the illustration in FIG. 4, while complying with a specified industry standard.

Figure 5:
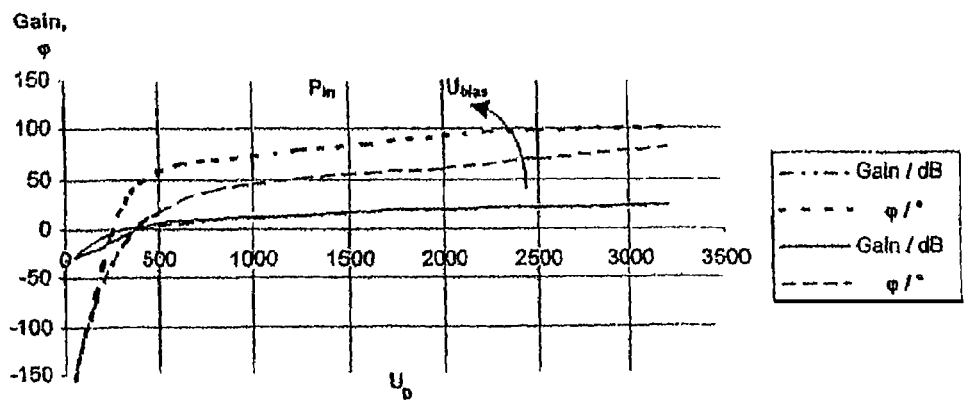
FIG. 5 shows measurement data for a real amplifier, in the form of the gain and phase angle, for one input power level.
Figure 6:
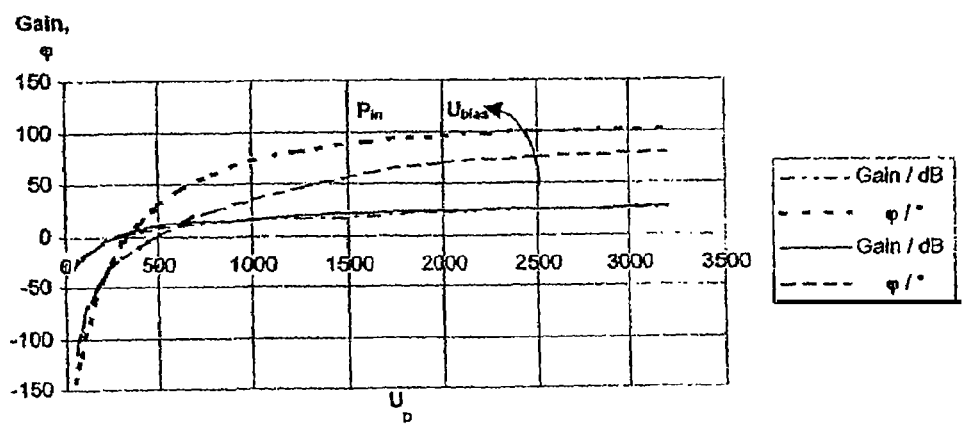
FIG. 6 illustrates, in the form of a graph, the data for another input power level as curves.

Measurement data were recorded on a real component in order to carry out amplitude modulation in an EDGE transmitter which is operating on the polar loop principle. An MOS transistor amplifier was used for this purpose in the exemplary embodiment which is discussed in the following text. The magnitude and phase of the complex parameter $S_{21}$ were measured as a function of $U_{DS}$ using values of the so-called bias voltage $U_{bias}$ and, in each case, two different input power levels Pin as parameters. In the end, the connection of the bias voltage $U_{bias}$ via a voltage divider controls the gates of the transistors (which are contained in the component) of the transmitter amplifier PA in order to adjust the operating point. As the illustrations in the form of graphs of the measurement values in FIGS. 5 and 6 show, the phase of the variable $S_{21}$ rises monotonally with the voltage $U_{DS}$, the abscissa. In contrast, the phase of $S_{21}$ falls as the voltage $U_{bias}$ increases. The input power Pin in the illustration in FIG. 5 was chosen to be higher than that in FIG. 6, although this does not have an excessively significant effect on the phase profile.

Figure 7:
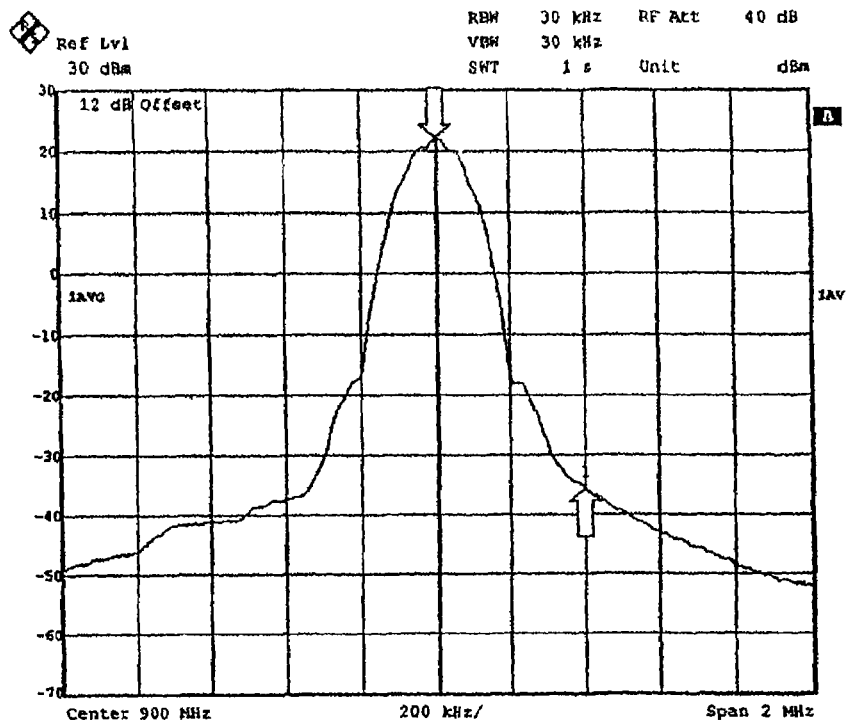
FIG. 7 illustrates a measured spectrum of an amplifier that is not subject to the influence of a compensation network.

FIG. 7 shows the modulation spectrum of the EDGE transmitter for a constant bias voltage $U_{bias}$. The spectrum is asymmetric, which clearly indicates that undesirable phase modulation has occurred. Compliance with a predetermined modulation spectrum or adjacent channel power rejection ACPR for a mid-frequency from about +400 kHz is accordingly approximately 56 dBc, as measured between the positions marked by two arrows.

Figure 8:
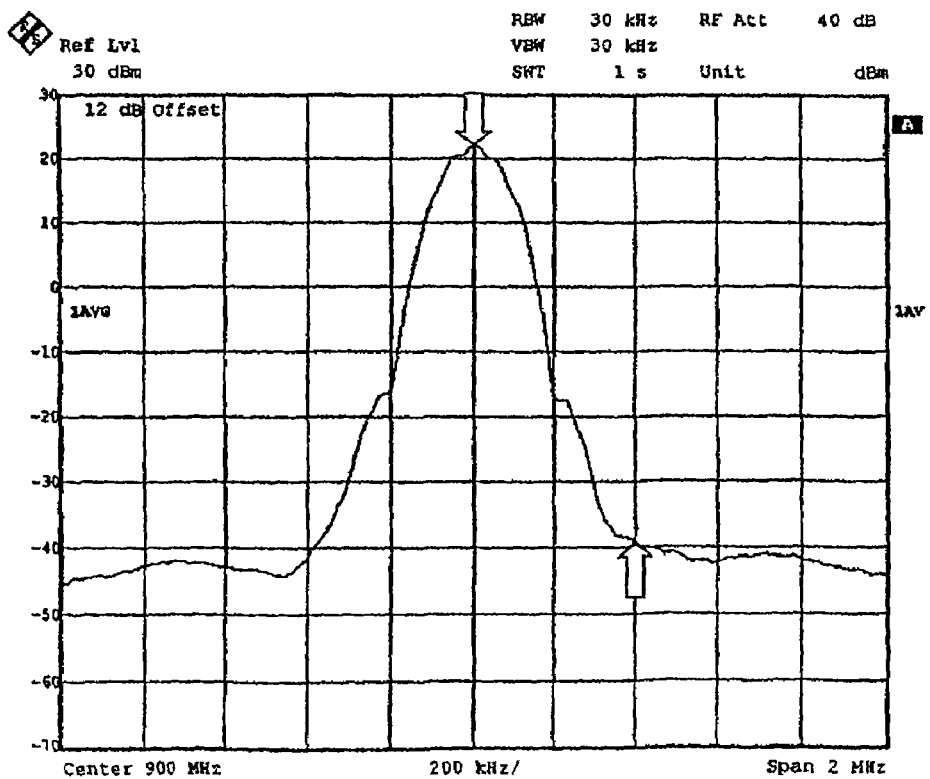
FIG. 8 shows a measured spectrum of the same amplifier subject to the influence of a compensation network according to the present invention.

FIG. 8 shows the modulation spectrum for the same EDGE transmitter with the modification that the so-called bias input is connected to the drain voltage $U_D(A(t))$ via a simple resistive voltage divider in order to set the correction factor k. The spectrum when using this simple correction circuit K is largely symmetrical, as a result of which only the component of undesirable phase modulation in the output signal will have been reduced to a very major extent. Furthermore, the attenuation with an adjacent channel ACPR at −400 kHz and +400 kHz away from the mid-frequency is now uniformly an improved value of approximately 61 dBc, once again measured between the arrows at the positions shown in FIG. 4.

Figure 9:
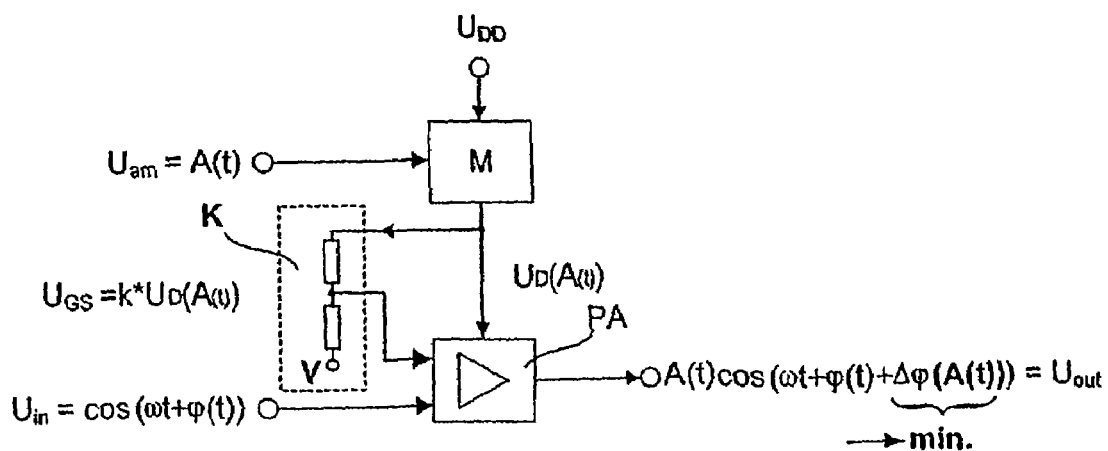
FIG. 9 shows the configuration chosen in the present exemplary embodiment, analogously to the illustration shown in FIG. 4.

The illustration in FIG. 9 shows the configuration chosen in the present exemplary embodiment, which is analogous to the illustration in FIG. 4. In this embodiment, the correction circuit K for adjustment of the correction factor k has only a simple resistive voltage divider, whose free end point is at a potential V, which can be set such that it is fixed. Two or more such correction circuits K can be provided with different potentials V, which are connected as required or after selection of a band, for use in different bands.

The advantages of the described embodiment are, for example, in the case of dual-band mobile radio, in particular, that static or nonvolatile memories can be used for the correction variables k, particularly in the form of fixed voltage dividers, to which a value is applied for each of the bands which can be selected. Operation in two or more bands is thus dependent only on a circuit K which is larger to a small extent, but does not result in any other change to the circuit. The advantage of a compact construction is thus retained for every application of an apparatus according to the present invention. However, the entire circuit of the polar loop transmitter PLS also may be in the form of a large-scale integrated circuit. The apparatus according to the present invention and with a very compact form is thus suitable for use in two or more frequency bands; in particular, for mobile telephones designed for multiband systems.

Although the present invention has been described with reference to specific embodiments, those of skill in the art will recognize that changes may be made thereto without departing from the spirit and scope of the present invention as set forth in the hereafter appended claims.

The invention claimed is:

1. A method for controlling the amplification of a high-frequency signal wherein the phase position and amplitude of an error-free input signal, separated from one another, are compared with a defined portion of an output signal of a transmission amplifier and are readjusted, comprising the steps of:
    measuring and evaluating an output voltage of a battery voltage modulator allocated to the transmission amplifier as a measure for an error at an output of the transmission amplifier;
    determining a correction value from the input signal and the measured output voltage of the battery voltage modulator in order to compensate the error; and
    modifying an input control signal of the battery voltage modulator by the correction value by driving a controlled intermediate amplifier amplifying a signal of an amplitude comparator and preceding the battery voltage modulator.

2. The method according to claim 1, wherein the error at the output of the transmission amplifier is a change in the closed loop bandwidth of the amplitude closed loop upon at least one of a mismatch and a change in impedance of an antenna.

3. The method according to claim 1, wherein at least one of the correction values and a family of characteristic curve are stored in a memory, taking into account tolerance values.

4. The method according to claim 3, wherein the correction values are at least one of read and generated with A/D and D/A converters.

5. The method according to claim 4, wherein at least one of the correction values and a family of characteristics are stored in a memory according to a respectively predetermined mobile radio standard in a system controller.

6. A method for controlling the amplification of a high-frequency signal wherein the phase position and amplitude of a faultless input signal, separated from one another, are compared with a defined portion of an output signal of a transmission amplifier and are readjusted, comprising the steps of:
    storing at least one of correction values and a family of characteristics in a memory of a system controller according to a respectively predetermined mobile radio standard;

measuring and evaluating an output voltage of a battery voltage modulator, allocated to the transmission amplifier, for an error at an output of the transmission amplifier;

reading out a corresponding correction value with the input signal and the measured output voltage of the battery voltage modulator in order to compensate the error; and modifying an input control signal of the battery voltage modulator by the correction value.

7. A unit for at least one of transmitting and receiving a radio-frequency signal and for controlling a gain of the radio-frequency signal, comprising:

a phase comparator and an amplitude comparator that separately compare a phase position and an amplitude of an error-free input signal with a defined portion of an output signal of a transmission amplifier;

a system controller that evaluates the input signal and a current output voltage of a battery voltage modulator of an amplitude closed loop wherein said battery voltage modulator is allocated to the transmission amplifier, and wherein the system controller outputs correction values for compensating a modification of the closed loop bandwidth of the amplitude closed loop; and a controlled intermediate amplifier that precedes the battery voltage modulator and amplifies a signal of an amplitude comparator in the amplitude closed loop and is connected to the system k controller, wherein an input control signal of the battery voltage modulator is modified for the compensation of the modification of the closed loop bandwidth by driving the controlled intermediate amplifier with the correction values.

8. The unit according to claim 7, wherein the system control comprises a device wherein at least one of the correction values and a characteristic curve are stored in a non-volatile memory.

9. The unit according to claim 7, wherein the system controller includes at least one of an A/D and a D/A converter for respectively reading and converting correction values.

10. The unit according to claim 7, wherein the system controller is at least one of a large-scale integrated assembly and an integrated circuit.

11. The unit according to claim 7, wherein the system controller is suitable for use in at least two frequency bands.

12. The unit according to claim 7, wherein the unit is one of a mobile radio and a mobile telephone.

13. The unit according to claim 7, wherein the unit is incorporated in a communications system for transmitting at least one of data and information via at least one radio interface.

14. A method for controlling the amplification of a high-frequency signal wherein a separate phase position and amplitude of a faultless input signal are compared with a defined portion of an output signal of a transmission amplifier and are readjusted, comprising the steps of:

measuring and evaluating an output voltage of a battery voltage modulator, allocated to the transmission amplifier, for an expected phase error as a result of parasitic phase modulation at an output of a transmission amplifier;

determining a correction value on the basis of the measured output voltage of the battery voltage modulator via a voltage divider, wherein correction values are at least one of read and generated via accesses with A/D and D/A converters; and supplying the determined correction value to the transmission amplifier for compensating the parasitic phase modulation, wherein at least one of the correction values and a family of characteristics are stored in a memory according to a respectively predetermined mobile radio standard in a correction circuit.

15. The method according to claim 14, wherein at least one of correction values and a family of characteristic curves are stored in a correction circuit, taking into account tolerance values.

16. A method for controlling the amplification of a high-frequency signal wherein a separate phase position and amplitude of a faultless input signal are compared with a defined portion of an output signal of a transmission amplifier, comprising the steps of:

storing at least one of correction values and a family of characteristics in a memory of a system controller according to a respectively predetermined mobile radio standard;

measuring and evaluating an output voltage of a battery voltage modulator for an expected phase error due to parasitic phase modulation at an output of the transmission amplifier, wherein the battery voltage modulator is allocated to the transmission amplifier; and determining a correction value for compensating the parasitic phase modulation by the measured output voltage of the battery voltage modulator.

17. The method according to claim 16, further comprising:

producing a correction signal using the measured output voltage of the battery voltage modulator and the correction value.

18. The method according to claim 17, wherein the correction signal is forwarded to the transmission amplifier and changes the operating point of the transmission amplifier by adjusting the bias voltage.

19. A unit performing at least one of transmitting and receiving a radio-frequency signal and for controlling a gain of the radio-frequency signal, comprising:

a phase comparator and an amplitude comparator that separately compare a phase position and an amplitude of an error-free input signal with a defined portion of an output signal of a transmission amplifier;

a system controller with a memory for storing at least on or correction values and a family of characteristics in a memory of a system controller according to a respectively predetermined mobile radio standard, wherein the system controller evaluates the input signal and a current output voltage of a battery voltage modulator of an amplitude-closed loop and wherein said battery voltage modulator is allocated to the transmission amplifier and wherein the system controller outputs correction values for compensating a modification of a closed-loop bandwidth of the amplitude-closed loop.

* * * * *

UNITED STATES PATENT AND TRADEMARK OFFICE
CERTIFICATE OF CORRECTION

PATENT NO.        : 7,386,287 B2                                Page 1 of 1
APPLICATION NO. : 10/482848
DATED             : June 10, 2008
INVENTOR(S)      : Roland Jenkins et al.

It is certified that error appears in the above-identified patent and that said Letters Patent is hereby corrected as shown below:

Col. 1, Ln. 57: Before "large amount," delete "rather a" and insert --a rather--;

Col. 2, Ln. 66: Before "preferably is," insert --,-- around --,such as this,--;

Col. 3, Ln. 60: Before "also will be," delete "results" and insert --result--;

Col. 6, Ln. 32: Before "multiple bands" delete "more"; and

Col. 10, Ln. 48: After "storing at least," delete "on or" and insert --one of--.

Signed and Sealed this

Fifth Day of October, 2010

David J. Kappos
*Director of the United States Patent and Trademark Office*